(12) United States Patent
Chang

(10) Patent No.: US 9,361,989 B1
(45) Date of Patent: Jun. 7, 2016

(54) MEMORY DEVICE AND DATA ERASING METHOD THEREOF

(71) Applicant: MACRONIX INTERNATIONAL CO., LTD., Hsinchu (TW)

(72) Inventor: Kuo-Pin Chang, Miaoli County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/571,351

(22) Filed: Dec. 16, 2014

(51) Int. Cl.
*G11C 11/34* (2006.01)
*G11C 16/14* (2006.01)
*G11C 16/04* (2006.01)

(52) U.S. Cl.
CPC ............ *G11C 16/14* (2013.01); *G11C 16/0483* (2013.01)

(58) Field of Classification Search
USPC .............. 365/185.17, 185.18, 185.29, 185.33
See application file for complete search history.

(56) References Cited

U.S. PATENT DOCUMENTS

| | | | | |
|---|---|---|---|---|
| 8,873,296 B2* | 10/2014 | Itagaki | ............... | G11C 16/0483 365/185.18 |
| 8,923,047 B2* | 12/2014 | Choi | ................... | G11C 16/0483 365/185.17 |
| 8,976,603 B2* | 3/2015 | Iwai | ........................ | G11C 16/10 365/185.17 |
| 9,105,335 B2* | 8/2015 | Maejima | ............ | G11C 16/0483 |
| 9,122,568 B2* | 9/2015 | Aritome | ................... | G06F 12/00 |

* cited by examiner

*Primary Examiner* — Trong Phan
(74) *Attorney, Agent, or Firm* — McClure, Qualey & Rodack, LLP

(57) ABSTRACT

A memory device comprises a first memory string and a second memory string. The first memory string is coupled to a first bit line and a plurality of word lines, and the second memory string is coupled to a second bit line and the word lines. When an erasing voltage is applied to the word lines, a first voltage is applied to the first bit line to erase data stored in the first memory string, and a second voltage is applied to the second bit line to set the second memory string to be floating.

20 Claims, 5 Drawing Sheets

MEMORY DEVICE AND DATA ERASING METHOD THEREOF

TECHNICAL FIELD

The disclosure relates in general to a memory device and a data erasing method thereof

BACKGROUND

NAND flash memories are commonly used in various devices, such as mobile phones, personal computers (PCs), laptops and tablet PCs. A typical erasing scheme for a NAND flash memory is block-based. That is, all pages in a memory block are erased even the user only requires to erase few pages. Accordingly, before performing block erasing, the typical erasing scheme needs to write the residual page data into another memory block. After all pages in a memory block are erased, the residual page data are written back to the original memory block. However, such erasing scheme takes much time in garbage collection and much time in wear leveling.

SUMMARY

The present invention is directed to a memory device and a data erasing method thereof.

According to one aspect of the present invention, a memory device is provided. The memory device comprises a first memory string and a second memory string. The first memory string is coupled to a first bit line and a plurality of word lines, and the second memory string is coupled to a second bit line and the word lines. When an erasing voltage is applied to the word lines, a first voltage is applied to the first bit line to erase data stored in the first memory string, and a second voltage is applied to the second bit line to set the second memory string to be floating.

According to another aspect of the present invention, a memory device is provided. The memory device comprises a plurality of first memory strings and a plurality of second memory strings. The first memory strings are coupled to a plurality of first bit lines, and the second memory strings are coupled to a plurality of second bit lines. When an erasing voltage is applied to the first and second memory strings through a plurality of word lines, a first voltage is applied to the first bit lines to erase data stored in the first memory strings, and a second voltage is applied to the second bit lines to set the second memory strings to be floating.

According to still another aspect of the present invention, a data erasing method of a memory device is provided, wherein the memory device comprises a first memory string coupled to a first bit line and the second memory string coupled to a second bit line. The data erasing method comprising the following steps: an erasing voltage is applied to the first memory string and the second memory string through a plurality of word lines. A first voltage is applied to the first bit line to erase data stored in the first memory string. A second voltage is applied to set the second memory string to be floating.

Figure 1:
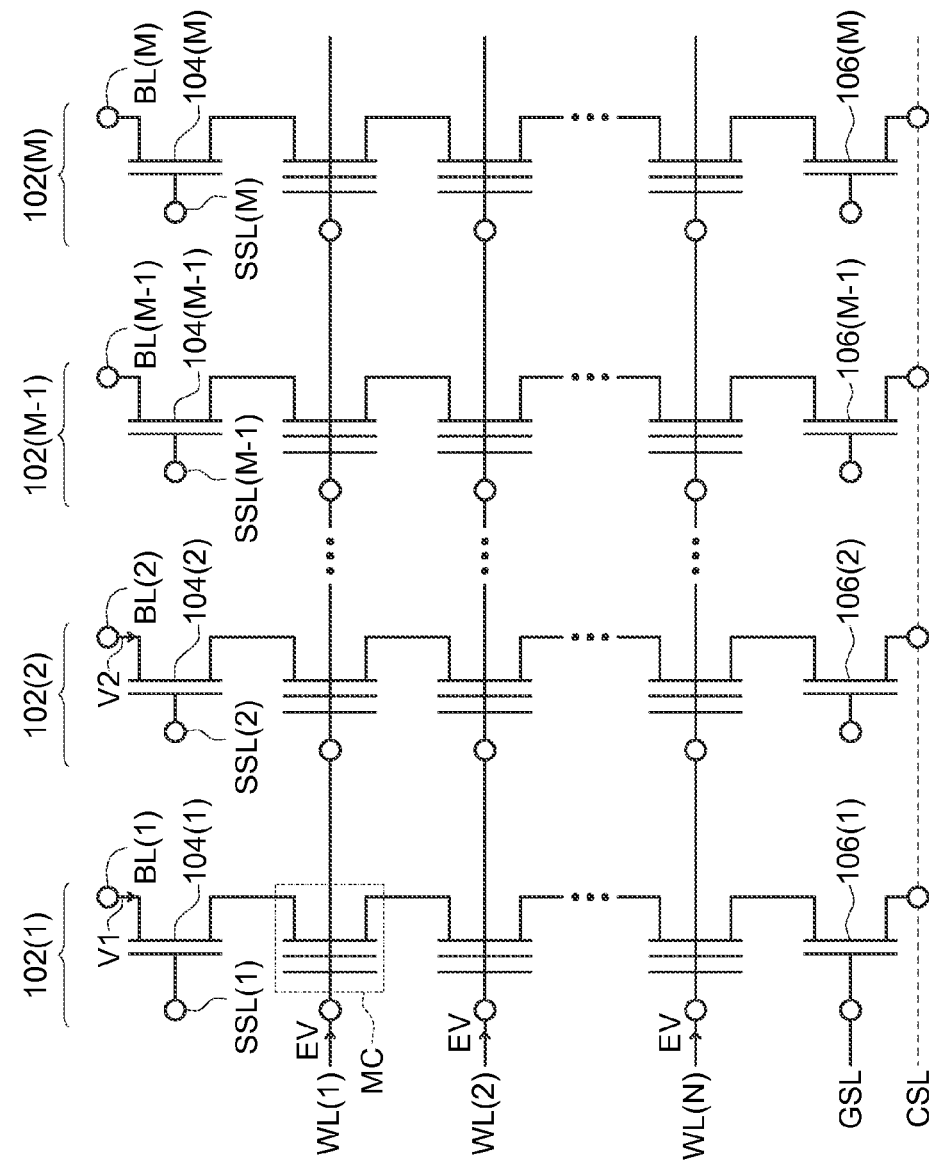
FIG. 1 shows a schematic diagram of a memory device 100 according to one embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a schematic diagram of a memory device 100 according to one embodiment of the present invention. The memory device 100 comprises a plurality of memory strings 102(1)-102(M). The memory strings 102(1)-102(M) are coupled to bit lines BL(1)-BL(M) and word lines WL(1)-WL(N). The intersections of the memory strings 102(1)-102(M) and the word lines WL(1)-WL(N) define a plurality of memory cells MC for storing data. The memory device 100 can be a three dimensional (3D) NAND flash memory, a two dimensional (2D) NAND flash memory, a NOR flash memory or a one time program (OTP) memory. In one embodiment, the memory strings 102(1)-102(M) belong to the same memory block of the memory device 100.

Each of the memory strings 102(i) comprises a string select transistor 104(i), where i=1, 2, . . . , M. Each string select transistor 104(i) includes a first terminal and a second terminal respectively coupled to a corresponding string select line SSL(i) and a corresponding bit line BL(i).

Each of the memory strings 102(i) further comprises a ground select transistors 106(i). Each ground select transistor 106(i) includes a first terminal and a second terminal respectively coupled to a ground select line GSL and a common source line CSL. In one embodiment, the ground select transistors 106(1)-106(M) are coupled to the same ground select line GSL and common source line CSL.

Figure 2:
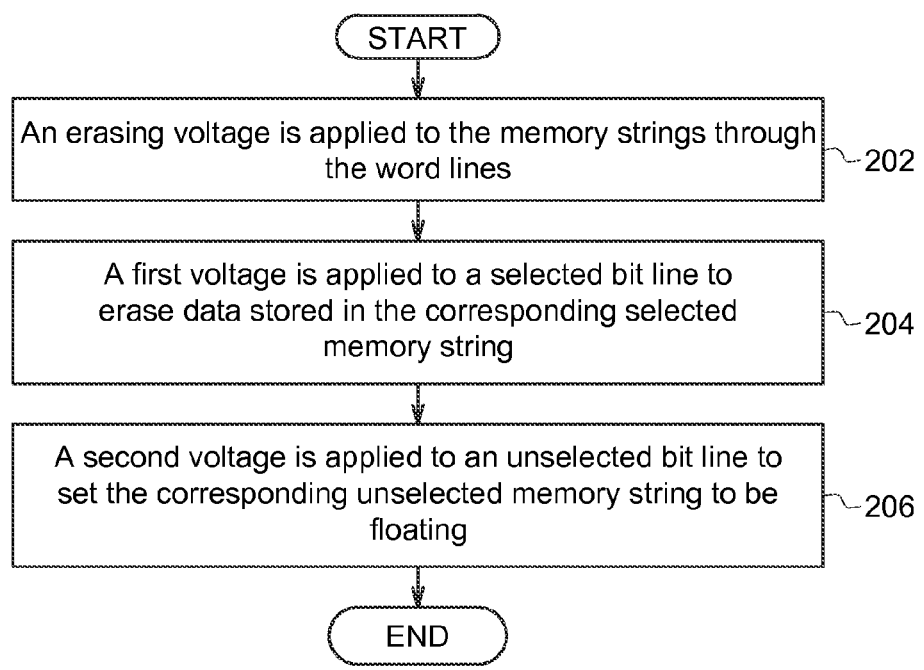
FIG. 2 shows a flow chart of a data erasing method of the memory device 100 according to one embodiment of the present invention.

FIG. 2 shows a flow chart of a data erasing method of the memory device 100 according to one embodiment of the present invention. At step 202, an erasing voltage EV is applied to the memory strings 102(1)-102(M) through the word lines WL(1)-WL(N). At step 204, a first voltage V1 is applied to a selected bit line to erase data stored in the corresponding selected memory string. At step 206, a second voltage V2 is applied to an unselected bit line to set the corresponding unselected memory string to be floating.

Assume that the memory string 102(1) is the selected memory string and the memory string 102(2) is unselected memory string. For the selected memory string 102(1), the string select transistor 104(1) may generate a gate-induced drain leakage (GIDL) current when the erasing voltage EV (e.g., −10V) is applied to the word lines WL(1)-WL(N) and the first voltage V1 (e.g., 8V) is applied to the corresponding bit line BL(1). The channel voltage of the memory string 102(1) is then charged to the first voltage V1 approximately, and data stored in the memory string 102(1) is erased. In one embodiment, the voltage of the string select line SSL(1) (e.g., 2V to 3.3V) is smaller than the first voltage V1.

For the unselected memory string 102(2), the string select transistor 104(2) is turned off when the erasing voltage EV is applied to the word lines WL(1)-WL(N) and the second voltage V2 (e.g., 2V to 3.3V) is applied to the corresponding bit line BL(2). Then, the unselected memory string 102(2) is floating and without involving GIDL generation.

In one embodiment, the voltage of the string select line SSL(2) is equal to the second voltage V2. In another embodiment, the voltage of the string select line SSL(2) can be smaller than the second voltage V2, but the voltage difference between the string select line SSL(2) and the second voltage V2 is not enough to make the string select transistor 104(2) produce GIDL current.

In the example of FIG. 1, the selected memory string 102(1) and the unselected memory string 102(2) are coupled to the same ground select line GSL and common source line CSL. When the erasing voltage EV is applied to the word lines WL(1)-WL(N), both of the ground select transistor 106(1) of the selected memory string 102(1) and the ground select transistor 106(2) of the unselected memory string 102(1) are turned off. In one example, the voltage of the common source line CSL is equal to the voltage of the ground select line GSL.

Therefore, in one embodiment, the GIDL generation happens at one side (SSL side) of the selected memory string, and no GIDL generation occurs at both sides (SSL side and GSL side) of the unselected memory string.

Figure 3A:
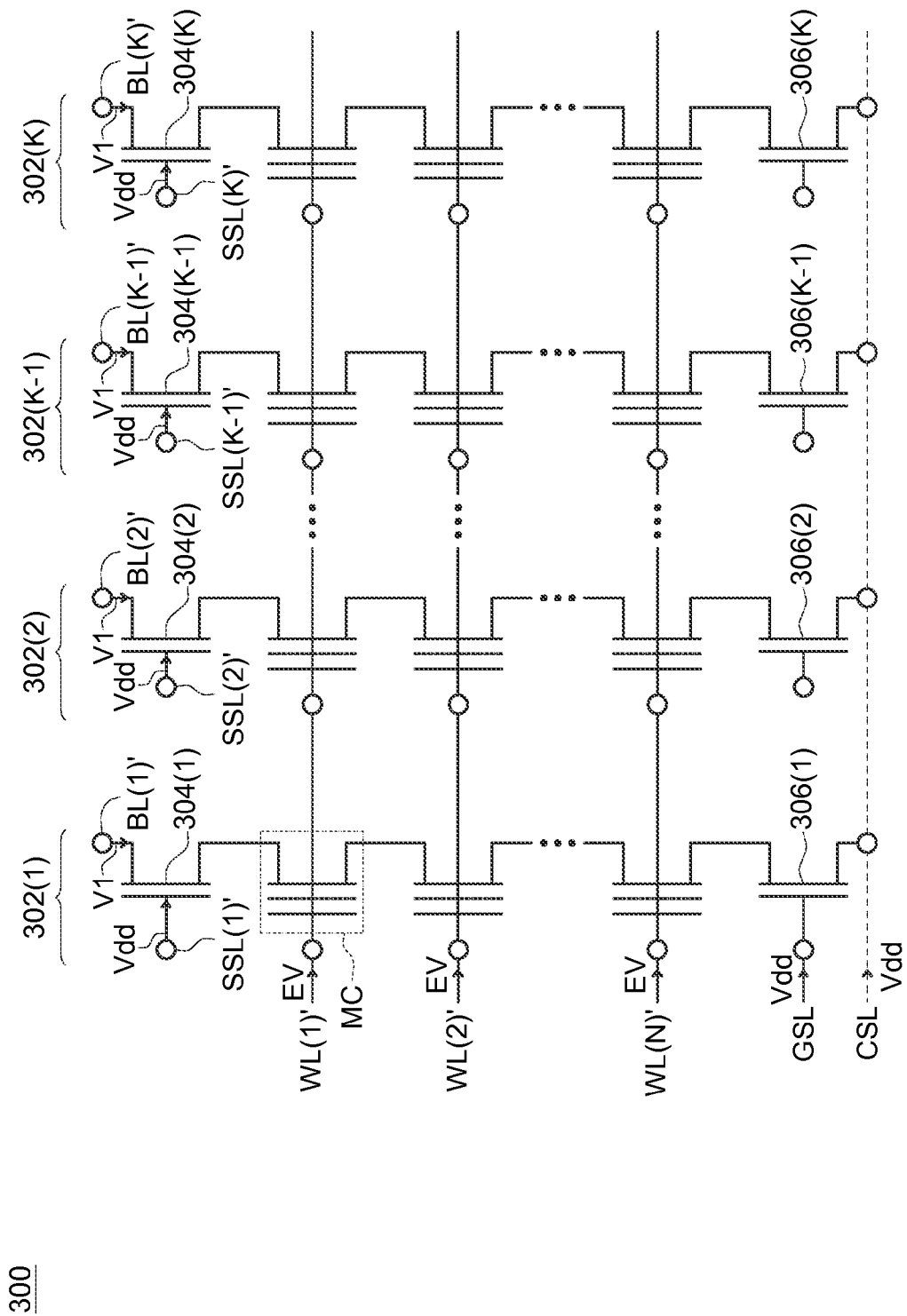
FIG. 3A shows an exemplary bias configuration at the selected memory strings of a memory device.

FIG. 3A shows an exemplary bias configuration at the selected memory strings 302(1)-302(K) of a memory device 300. In the example of FIG. 3A, an erasing voltage EV is applied to the memory strings 302(1)-302(K) through the word lines WL(1)'-WL(N)' during a data erasing period. The bit lines BL(1)'-BL(K)' are biased by a first voltage V1. The string select lines SSL(1)'-SSL(K)', the ground select line GSL and the common source line CSL which are coupled to the ground select transistors 306(1)-306(K), are biased by a voltage Vdd (e.g., 2V to 3.3V). Because there is a high voltage difference between the respective gate terminals and drain terminals of the string select transistors 304(1)-304(K), GIDL currents are generated at the SSL sides of the memory strings 302(1)-302(K), causing data of the memory string 302(1)-302(K) to be erased.

Figure 3B:
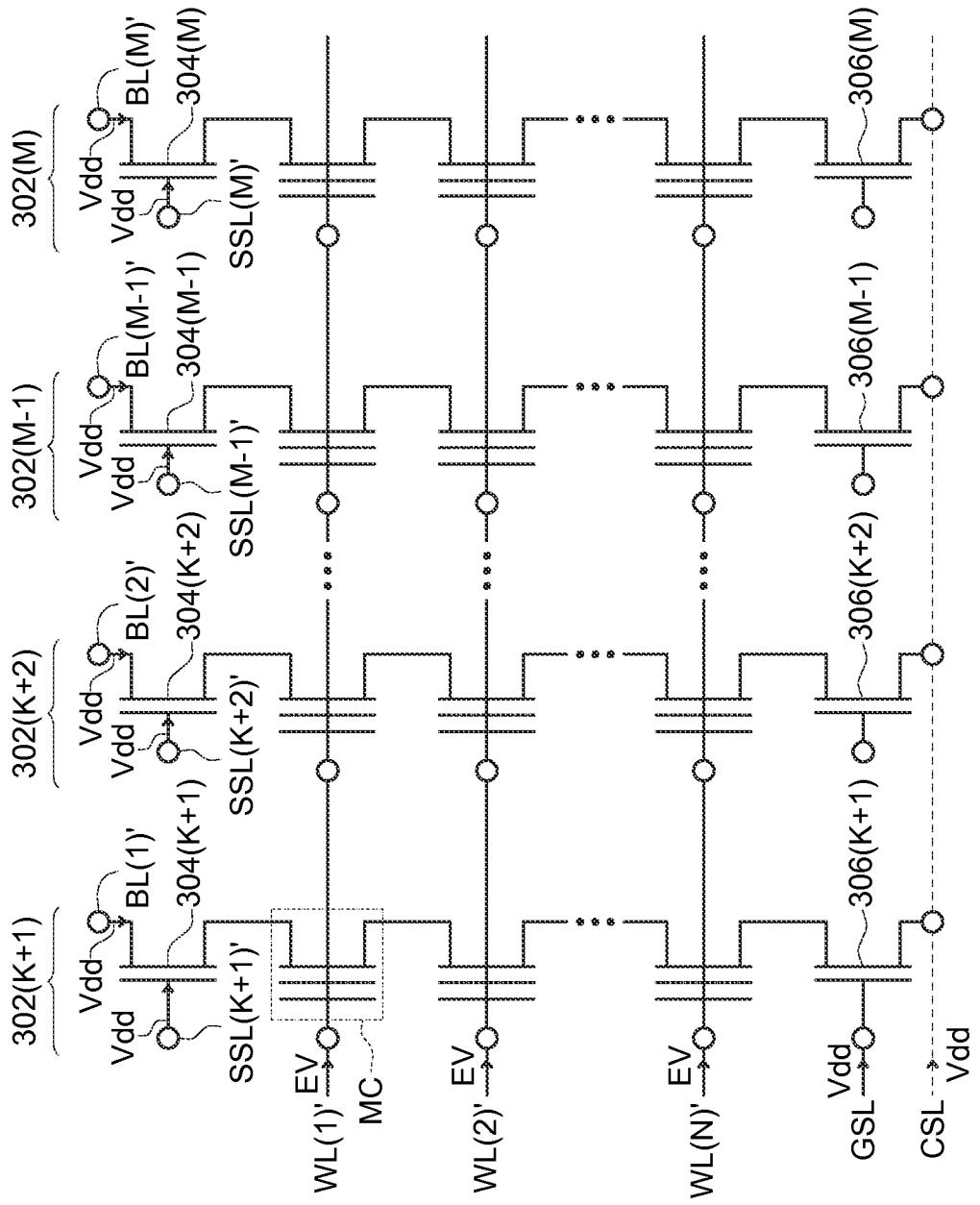
FIG. 3B shows an exemplary bias configuration at the unselected memory strings of the memory device.

FIG. 3B shows an exemplary bias configuration at the unselected memory strings 302(K+1)-302(M) of the memory device 300. The unselected memory strings 302(K+1)-302(M) and the memory strings 302(1)-302(K) shown in FIG. 3A belong to the same memory block. The erasing voltage EV is applied to the memory block through the word lines WL(1)'-WL(N)' during the data erasing period. The bit lines BL(K+1)'-BL(M)', the string select lines SSL(K+1)'-SSL (M)' coupled to the string select line 304(K+1)-304(M), the ground select line GSL and the common source line CSL coupled to the ground select transistors 306(K+1)-306(M) are biased by the same voltage Vdd. The voltage Vdd applied to the bit lines BL(K+1)'-BL(M)' can be regarded as the second voltage V2 as mentioned above. Similar to a self-boosting scheme in a programming procedure, the ground select transistors 306(K+1)-306(M) are turned off and without involving the GIDL generation. At this time, the memory strings 302(K+1)-302(M) are floating, and the respective channel voltages of the memory strings 302(K+1)-302(M) are determined by a coupling of the erasing voltage EV. Given that a coupling ratio of the erasing voltage EV is Cr and the initial channel voltage of each of the memory strings 302(K+1)-302 (M) is Vini, the respective channel voltages of the memory strings 302(K+1)-302(M) can be expressed as follows:

$$Vini+EV*Cr$$

If the initial channel voltage Vini is 1.8V (Vdd−0.7V), the erasing voltage EV is −10V and the coupling ratio Cr is 0.8, it can be obtained that the respective channel voltages of the memory strings 302(K+1)-302(M) are −6.2V. Because the voltage difference between the respective channels of the memory strings 302(K+1)-302(M) and the word lines WL(1) '-WL(N)' is small (10−6.2=3.8V), data stored in the memory string 302(K+1)-302(M) are not erased.

Figure 4:
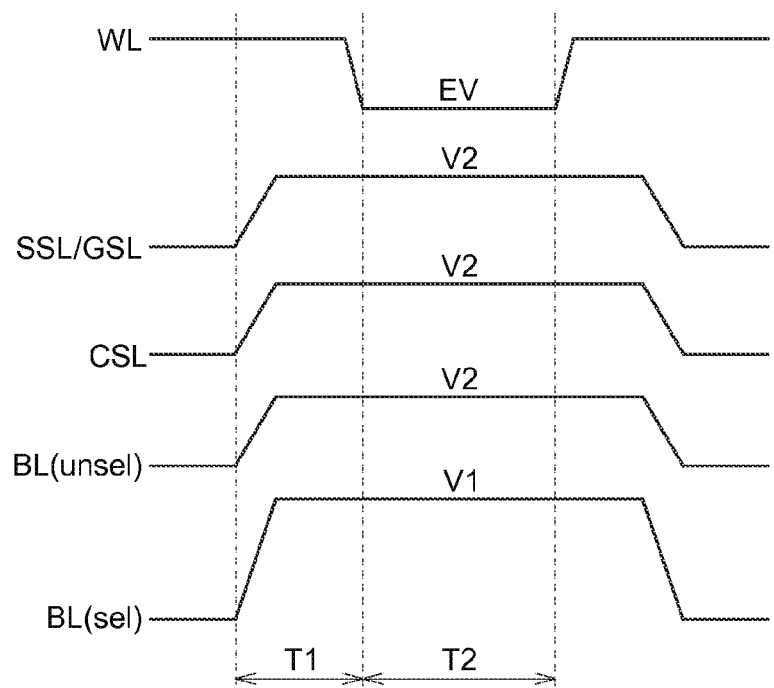
FIG. 4 shows exemplary waveforms of an erasing scheme according to one embodiment of the present invention.

FIG. 4 shows exemplary waveforms of an erasing scheme according to one embodiment of the present invention. As shown in FIG. 4, the string select line SSL, the ground select line GSL, the common source line CSL and a unselected bit line BL(unsel) are biased by the second voltage V2 (e.g., 2V to 3.3V) during a first time period T1. For a memory string selected to be erased, the corresponding bit line BL(sel) is biased by the first voltage V1 (e.g., 8V).

During a second period T2, an erasing voltage EV (e.g., −10V) is applied to the word line WL. For the selected memory string, data of the memory cells are erased due to the GIDL generation. For the unselected memory string, the memory channel is floating, and the channel voltage is determined by the strong coupling of the erasing voltage EV. Therefore, data stored in the unselected memory string are not erased even though the word line WL is biased by the erasing voltage EV.

Figure 5:
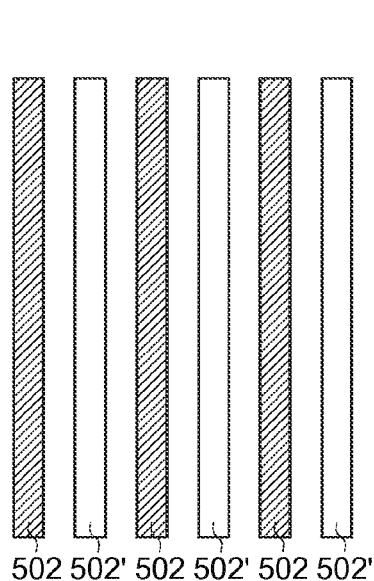
FIG. 5 shows an exemplary grouping configuration of memory strings according to one embodiment of the present invention.

FIG. 5 shows an exemplary grouping configuration of memory strings according to one embodiment of the present invention. In the example of FIG. 5, the memory strings 502 and the memory strings 502' are arranged alternately. Odd bit lines connecting to the memory strings 502 and even bit lines connecting to the memory strings 502' are separately grouping. As mentioned above, for the selected group of memory strings, the corresponding bit lines can be biased by the first voltage V1 to erase data, and for the unselected group of memory strings, the corresponding bit lines can be biased by the second voltage V2 to set the unselected memory strings to be floating.

Figure 6:
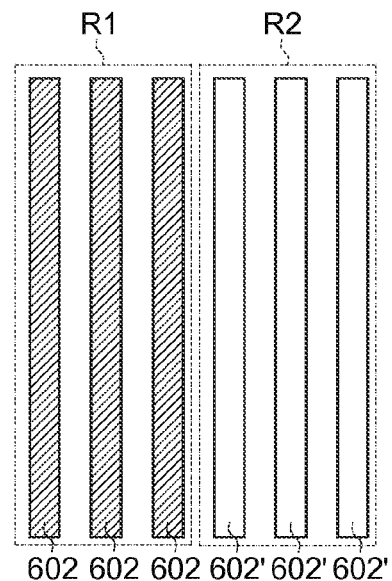
FIG. 6 a schematic diagram of a grouping configuration of memory strings according to another embodiment of the present invention.

FIG. 6 a schematic diagram of a grouping configuration of memory strings according to another embodiment of the present invention. As shown in FIG. 6, the memory strings 602 are located in a first region R1 and the memory strings 602' are located in the second region R2. The first region R1 is adjacent to the second region R2. Bit lines connecting to the memory strings 602 and bit lines connecting to the memory strings 602' are separately grouping. As mentioned above, for the selected group of memory strings, the corresponding bit lines can be biased by the first voltage V1 to erase data, and for the unselected group of memory strings, the corresponding bit lines can be biased by the second voltage V2 to set the unselected memory strings to be floating. However, the present invention is not limited to the above examples. Arbitrary bit line(s) can be grouped as a selected group or an unselected group.

In summary, the memory device and the data erasing method of the present invention divide bit lines in a memory block into two groups: a selected group and an unselected group. For the selected group, a first voltage is applied on the selected bit lines to erase data. For the unselected group, a second voltage is applied on the unselected bit lines to set the unselected memory strings to be floating and prevent the data of the unselected memory strings from being erased. Therefore, the memory device and the data erasing method of the present invention can reduce time in garbage collection and wear leveling, improving the product specification in erasing operation.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
a first memory string coupled to a first bit line and a plurality of word lines; and
a second memory string coupled to a second bit line and the word lines; wherein
when an erasing voltage is applied to the word lines, a first voltage is applied to the first bit line to erase data stored in the first memory string, and a second voltage is applied to the second bit line to set the second memory string to be floating.

2. The memory device of claim 1, wherein the first memory string comprises a first string select transistor coupled to the first bit line, and the second memory string comprises a second string select transistor coupled to the second bit line, wherein
when the erasing voltage is applied to the word lines, the first string select transistor generates a gate-induced drain leakage (GIDL) current, and the second string select transistor is turned off.

3. The memory device of claim 2, wherein the first string select transistor comprises a first terminal and a second terminal respectively coupled to the first bit line and a first string select line, and the second string select transistor comprises a first terminal and a second terminal respectively coupled to the second bit line and a second string select line; wherein
when the erasing voltage is applied to the word lines, the voltage of the first string select line is smaller than the first voltage, and the voltage of the second string select line is equal to the second voltage.

4. The memory device of claim 2, wherein the first memory string further comprises a first ground select transistor coupled to a common source line and the second memory string further comprises a second ground select transistor coupled to the common source line, wherein
when the erasing voltage is applied to the word lines, the first and second ground select transistors are turned off.

5. The memory device of claim 4, wherein the first ground select transistor and the second ground select transistor are coupled to the common source line and a ground select line, wherein
when the erasing voltage is applied to the word lines, the voltage of the common source line is equal to the voltage of the ground select line.

6. The memory device of claim 1, wherein when the erasing voltage is applied to the word lines, a channel voltage of the second memory string is determined by a coupling of the erasing voltage.

7. The memory device of claim 1, wherein the first memory string and the second memory string belong to a memory block, and the erasing voltage is applied to the memory block through the word lines.

8. A memory device, comprising:
a plurality of first memory strings coupled to a plurality of first bit lines; and
a plurality of second memory strings coupled to a plurality of second bit lines; wherein
when an erasing voltage is applied to the first and second memory strings through a plurality of word lines, a first voltage is applied to the first bit lines to erase data stored in the first memory strings, and a second voltage is applied to the second bit lines to set the second memory strings to be floating.

9. The memory device of claim 8, wherein each of the first memory strings comprises a first string select transistor coupled to a corresponding first bit line, and each of the second memory strings comprises a second string select transistor coupled to a corresponding second bit line, wherein
when the erasing voltage is applied to the word lines, the first string select transistors generate gate-induced drain leakage (GIDL) currents, and the second string select transistors are turned off.

10. The memory device of claim 9, wherein each of the first string select transistors comprises a first terminal and a second terminal respectively coupled to the corresponding first bit line and a first string select line, and each of the second string select transistors comprises a first terminal and a second terminal respectively coupled to the corresponding second bit line and a second string select line; wherein
when the erasing voltage is applied to the word lines, the voltages of the first string select lines are smaller than the first voltage, and the voltages of the second string select lines are equal to the second voltage.

11. The memory device of claim 9, wherein each of the first memory strings further comprises a first ground select transistor coupled to a common source line, and each of the second memory strings further comprises a second ground select transistor coupled to the common source line, wherein
when the erasing voltage is applied to the word lines, the first and second ground select transistors are turned off.

12. The memory device of claim 11, wherein the first ground select transistors and the second ground select transistors are coupled to the common source line and a ground select line, wherein
when the erasing voltage is applied to the word lines, the voltage of the common source line is equal to the voltage of the ground select line.

13. The memory device of claim 8, wherein when the erasing voltage is applied to the word lines, a channel voltage of each of the second memory strings is determined by a coupling of the erasing voltage.

14. The memory device of claim 8, wherein the first memory strings and the second memory strings belong to a memory block, and the erasing voltage is applied to the memory block through the word lines.

15. The memory device of claim 8, wherein the first memory strings and the second memory strings are arranged alternately.

16. The memory device of claim 8, wherein the first memory strings are located in a first region and the second memory strings are located in the second region, wherein the first region is adjacent to the second region.

17. A data erasing method of a memory device, wherein the memory device comprises a first memory string coupled to a first bit line and the second memory string coupled to a second bit line, the data erasing method comprises:
applying an erasing voltage to the first memory string and the second memory string through a plurality of word lines;

applying a first voltage to the first bit line to erase data stored in the first memory string; and applying a second voltage to set the second memory string to be floating.

18. The data erasing method of claim 17, wherein the first memory string comprises a first string select transistor coupled to the first bit line, and the second memory string comprises a second string select transistor coupled to the second bit line, the data erasing method further comprises:

when the erasing voltage is applied to the word lines:

generating a gate-induced drain leakage (GIDL) current at the first string select transistor; and turning off the second string select transistor.

19. The data erasing method of claim 18, wherein the first memory string further comprises a first ground select transistor coupled to a common source line and the second memory string further comprises a second ground select transistor coupled to the common source line, the data erasing method further comprises:

when the erasing voltage is applied to the word lines, turning off the first and second ground select transistors.

20. The data erasing method of claim 17, further comprises:

determining a channel voltage of the second memory string by a coupling of the erasing voltage when the erasing voltage is applied to the word lines.

* * * * *